US010391963B2

(12) United States Patent
Schnetger et al.

(10) Patent No.: US 10,391,963 B2
(45) Date of Patent: Aug. 27, 2019

(54) APPARATUS, SYSTEM, AND METHOD FOR DIAGNOSING INITIATORS IN AIRBAG SYSTEMS

(71) Applicant: SCHROTH SAFETY PRODUCTS, LLC, Pompano Beach, FL (US)

(72) Inventors: Mario Schnetger, Arnesberg (DE); Ray Garcia, Boca Raton, FL (US); Craig William White, Grosse Pointe, MI (US); Ahad M Zadeh, Rochester, MI (US); Stefan Meier-Arndt, Kamen (DE)

(73) Assignee: Schroth Safety Products LLC, Pompano Beach, FL (US)

( * ) Notice: Subject to any disclaimer, the term of this patent is extended or adjusted under 35 U.S.C. 154(b) by 128 days.

(21) Appl. No.: 15/798,595

(22) Filed: Oct. 31, 2017

(65) Prior Publication Data
US 2018/0050648 A1 Feb. 22, 2018

Related U.S. Application Data

(63) Continuation of application No. 15/294,947, filed on Oct. 17, 2016, now Pat. No. 9,827,938, which is a continuation of application No. 14/702,714, filed on May 2, 2015, now Pat. No. 9,499,115.

(60) Provisional application No. 61/987,490, filed on May 2, 2014.

(51) Int. Cl.
B60R 21/017 (2006.01)
B60R 21/01 (2006.01)
G01R 31/00 (2006.01)
G07C 5/00 (2006.01)

(52) U.S. Cl.
CPC .......... *B60R 21/0173* (2013.01); *B60R 21/01* (2013.01); *G01R 31/006* (2013.01); *G07C 5/008* (2013.01); *B60R 21/017* (2013.01); *B60R 2021/01184* (2013.01)

(58) Field of Classification Search
CPC ... B60R 21/0173; B60R 21/01; B60R 21/017; B60R 2021/01184; G01R 31/006; G07C 5/008
See application file for complete search history.

(56) References Cited

U.S. PATENT DOCUMENTS

| 6,098,548 | A | * | 8/2000 | Rink | C06B 47/02 102/202.14 |
| 6,845,947 | B1 | * | 1/2005 | Reese, Jr. | B64C 1/1476 244/120 |
| 2007/0055429 | A1 | * | 3/2007 | Komaki | B60R 21/013 701/45 |

(Continued)

Primary Examiner — Calvin Cheung
(74) Attorney, Agent, or Firm — Trueba & Suárez PLLC

(57) ABSTRACT

A method for diagnosing aircraft airbag initiators in air bag systems includes: providing a diagnostic circuit per aircraft seat, the diagnostic circuit being in a normally off condition and enabled by a user activation; providing a power supply independent of aircraft power; providing a momentary switch; providing a visual indicator; receiving a signal indicating user activation of the momentary switch; and responsive to receiving the signal: completing a circuit, regulating a current into the diagnostic circuit to prevent a squib from firing during diagnostic evaluation; detecting a voltage; and providing feedback to the user.

4 Claims, 4 Drawing Sheets

(56) References Cited

U.S. PATENT DOCUMENTS

| | | | | |
|---|---|---|---|---|
| 2012/0256403 A1* | 10/2012 | Shields | ............... | B60R 22/48 |
| | | | | 280/733 |
| 2013/0075524 A1* | 3/2013 | Islam | ............... | B64D 25/00 |
| | | | | 244/118.5 |
| 2013/0317701 A1* | 11/2013 | Ooyabu | ............... | B60R 21/013 |
| | | | | 701/45 |
| 2015/0232184 A1* | 8/2015 | Gehret | ............... | B64D 11/0621 |
| | | | | 244/121 |
| 2016/0052636 A1* | 2/2016 | Moeller | ............... | B64D 25/02 |
| | | | | 244/121 |
| 2016/0096627 A1* | 4/2016 | Gehret | ............... | B60R 21/207 |
| | | | | 244/121 |
| 2016/0280171 A1* | 9/2016 | Moeller | ............... | B60R 22/12 |

* cited by examiner

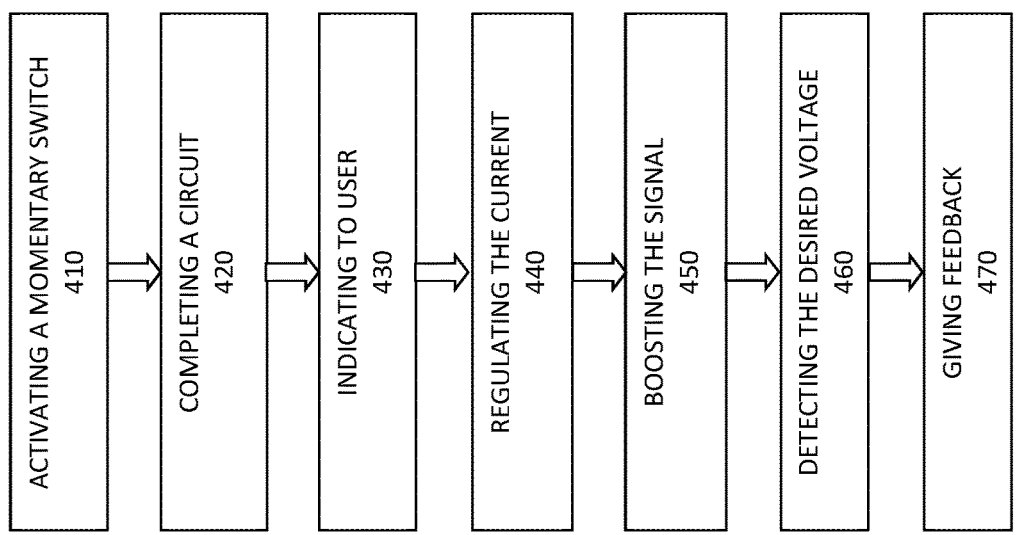

APPARATUS, SYSTEM, AND METHOD FOR DIAGNOSING INITIATORS IN AIRBAG SYSTEMS

CROSS-REFERENCE TO RELATED APPLICATIONS

This U.S. Non-Provisional patent application is a continuation application of, and claims the benefit of, currently pending U.S. Utility patent application Ser. No. 15/294,947, filed on Oct. 17, 2016, which is a continuation application of, and claims the benefit of U.S. Utility patent application Ser. No. 14/702,714, filed on May 2, 2015, now U.S. Pat. No. 9,499,115, which is a non-provisional of the now expired U.S. Provisional Patent Application No. 61/987,490, filed on 2 May 2014; all of which are incorporated by reference as if fully set forth herein.

FIELD OF THE INVENTION

This invention relates generally to the field of electrical diagnostic equipment, devices, and systems and related methods and, more specifically to systems and methods for diagnosing initiators in airbag systems.

BACKGROUND

It is known in the art for airbag inflation systems to utilize a battery or other power source to drive a circuit in order to fire an inflator under prescribed conditions, thereby inflating the airbag. The inflator is fired when acceleration switches, used to detect an impact, allow the current from the battery or other power source to flow through the circuit to an initiator, or squib, charges the initiator, which then ignites the inflator.

The integrity, or "health" of the circuit and, most importantly, of the squib, is paramount to the proper operation of the airbag in a crash event. If any part of the circuit fails, or if the squib itself fails, then the inflator will not fire and the airbag will not deploy.

The problem is that these circuits are typically "blind" systems. There is often no simple way to test the integrity of the system without inadvertently deploying the airbag.

Previous attempts to address this problem have incorporated diagnostic means that impose a power drain on the system while inactive. For battery powered airbag systems, such as those employed in aircraft, it is not desirable to have a diagnostic means that also drains the battery while not in use. Current attempts in the art have suffered from this problem where the continuous current draw drains the battery, rendering the firing system inoperable when it is needed the most—in a crash event. Other attempts in the prior art include a required second source of electrical energy in the monitoring and diagnostic circuit in addition to the primary electrical energy source used to power the firing system.

Other attempts to diagnose the integrity of the firing system fall short because they are not able to detect shorts or opens at individual squibs. This is a problem in systems where one electronic control module (ECM) may control the firing of multiple airbags. This is typically the situation in airbag systems for aircraft where one ECM may be used to deploy multiple airbags, one or more on each of a row of seats.

It would, therefore, be desirable to have a system and related method for diagnosing initiators in airbag systems where one, or more than one, initiator may be diagnosed individually, shorts or opens may be detected, with no power drain while inactive and without the need for a second source of electrical energy.

While certain aspects of conventional technologies and methods in the relevant art have been discussed to facilitate disclosure of the invention, Applicant in no way disclaims these technical aspects or methods, and it is contemplated that the claimed invention may encompass one or more of the conventional technical aspects or methods discussed herein.

In this specification, where a document, act, or item of knowledge is referred to or discussed, this reference or discussion is not an admission that the document, act, or item of knowledge or any combination thereof was, at the priority date, publicly available, known to the public, part of common general knowledge, or otherwise constitutes prior art under the applicable statutory provisions; or is known to be relevant to an attempt to solve any problem with which this specification is concerned.

SUMMARY

In this specification and in the appended claims and drawings, words and phrases have the meanings commonly attributed to them in the relevant art except as otherwise specified herein.

In this specification and in the appended claims and drawings, "initiator", including grammatical equivalents, singular and plural, is a pyrotechnic device, comprising a conductor and a combustible material that activates under a predetermined current pulse and ignites the combustible material thereby initiating a gas generator which inflates the airbag. The term "squib" is used interchangeably with "initiator."

The present invention may address one or more of the problems and deficiencies of the prior art discussed above. However, it is contemplated that the invention may prove useful in addressing other problems and deficiencies in a number of technical areas. Therefore the claimed invention should not necessarily be construed as limited to addressing any of the particular problems or deficiencies discussed herein.

In view of the foregoing, an embodiment herein provides a novel system and related method for diagnosing initiators in air bag systems. Specifically, an embodiment of the system comprises a diagnostic circuit electrically connected between the acceleration switches and the one or more squib, that is user-activated via a momentary switch, and with user-feedback, wherein a user can diagnose the health of the one or more squib with no power drain while inactive.

An embodiment of a method related to the system comprises activating a momentary switch, completing a circuit whereby a diagnostic circuit may function, indicating to the user that the diagnostic circuit is functioning, regulating the current into the diagnostic circuit so that the squib does not fire, boosting the signal to a window comparator, detecting the desired voltage by the window comparator, giving feedback to the user that the voltage is good, too high, or too low.

BRIEF DESCRIPTION OF THE DRAWINGS

These and other features, aspects, and advantages of the present invention will become better understood with regard to the following description, appended claims, and accompanying drawings where:

FIG. 4 illustrates a flow chart of the steps associated with a method for diagnosing initiators in air bag systems with no power drain while active according to an embodiment herein.

DESCRIPTION

Figure 1:
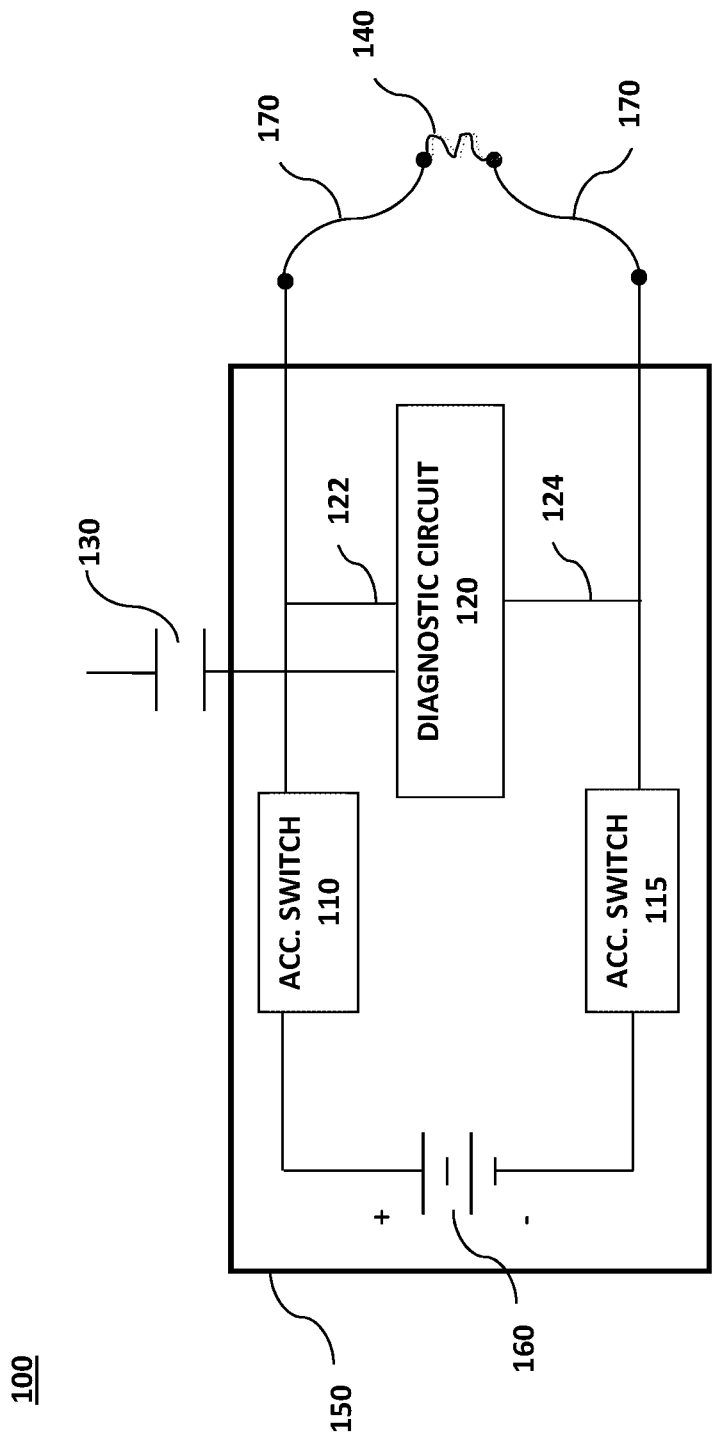
FIG. 1 illustrates a schematic view of an electronic control module apparatus with an integrated diagnostics system according to an embodiment herein.

In the Summary of the Invention above, in the Description and appended Claims below, and in the accompanying drawings, reference is made to particular features of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

The term "comprises" and grammatical equivalents thereof are used herein to mean that other components, ingredients, steps, etc. are optionally present. For example, an article "comprising" (or "which comprises") components A, B, and C can consist of (i.e., contain only) components A, B, and C, or can contain not only components A, B, and C but also one or more other components.

The term "at least" followed by a number is used herein to denote the start of a range beginning with that number (which may be a range having an upper limit or no upper limit, depending on the variable being defined). For example "at least 1" means 1 or more than 1. The term "at most" followed by a number is used herein to denote the end of a range ending with that number (which may be a range having 1 or 0 as its lower limit, or a range having no lower limit, depending upon the variable being defined). For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, 25 to 100 mm means a range whose lower limit is 25 mm, and whose upper limit is 100 mm.

While the specification will conclude with claims defining the features of embodiments of the invention that are regarded as novel, it is believed that the invention will be better understood from a consideration of the following description in conjunction with the figures, in which like reference numerals are carried forward.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein. Specifically, component names, types, and values, as depicted in the exemplary schematic diagrams, are not intended to limit the scope of the present invention and are presented only as possible embodiments.

We refer now to the various figures in general, and to FIG. 1 in particular. We discuss here an electronics control module (ECM) 100 for sensing a crash event and initiating an inflation sequence for one or more airbags with an integrated system for diagnosing one or more initiators 140, as described in the various embodiments herein. The ECM 100, according to an embodiment, may include a housing 150 enclosing one or more circuit boards (not illustrated for simplicity), to which may be electrically connected one or more wire harnesses 170 which themselves are electrically connected to one or more squibs 140. The ECM 100 further includes an electrical power source 160, such as a battery, and event sensing means such as acceleration switches 110 and 115 which are normally open but close to complete the circuit upon a predetermined event, such as a g-shock, or force, as in a crash event.

Figure 2:
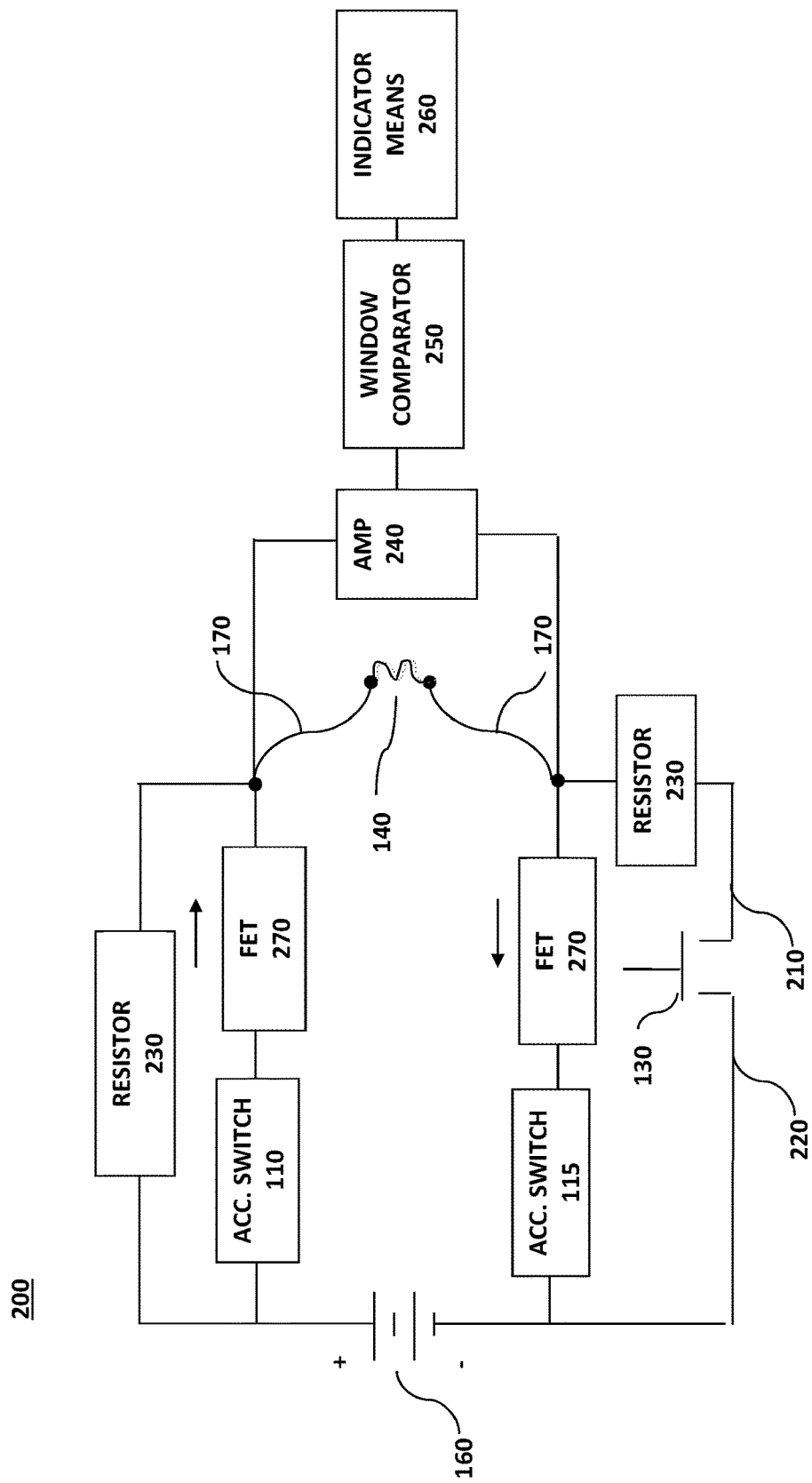
FIG. 2 illustrates a schematic view of a system for diagnosing initiators in airbag systems according to an embodiment herein.

Referring now to FIG. 2 and the drawings in general, embodiments of the present invention, as described here, and in the appended claims and drawings, include, but are not limited to, a system 200 for diagnosing the electrical integrity of a squib 140 and wire harness 170 activated by an electronics control module 100 comprising a momentary switch 130 which, when closed, connects a system ground 210 to an ECM ground 220, completing a circuit for a current to flow from the ECM to the system in order for the diagnostic circuit 120 to function. Resistors 230, or other current regulating means as are known in the art, are electrically connected in the diagnostic circuit 120 at a current high input 122 and a current low input 124 in order to regulate the current into the diagnostic circuit 120 to ensure that the squib 140 does not fire during diagnostics. It should be appreciated by one skilled in the art that the resistor 230 value is to be chosen based upon the squib 140 current requirements. A signal booster 240 is electrically connected to the diagnostic circuit 120 at the point of electrical connection to the harness 170 and squib 140. This signal booster 240 amplifies the signal to a window comparator 250. The window comparator 250 is electrically connected to the output of the signal booster 240 and determines if the voltage across the harness/squib is good, too high, or too low. One of skill in the art will recognize that the window comparator may include resistors and op-amps that are tuned to detect the desired voltage. The window comparator 250 includes outputs electrically connected to indicators 260, such as LEDs, to indicate to the user if the voltage is good, high, or low, thereby indicating to the user if the squib and harness integrity is within the desired parameters.

Figure 3:
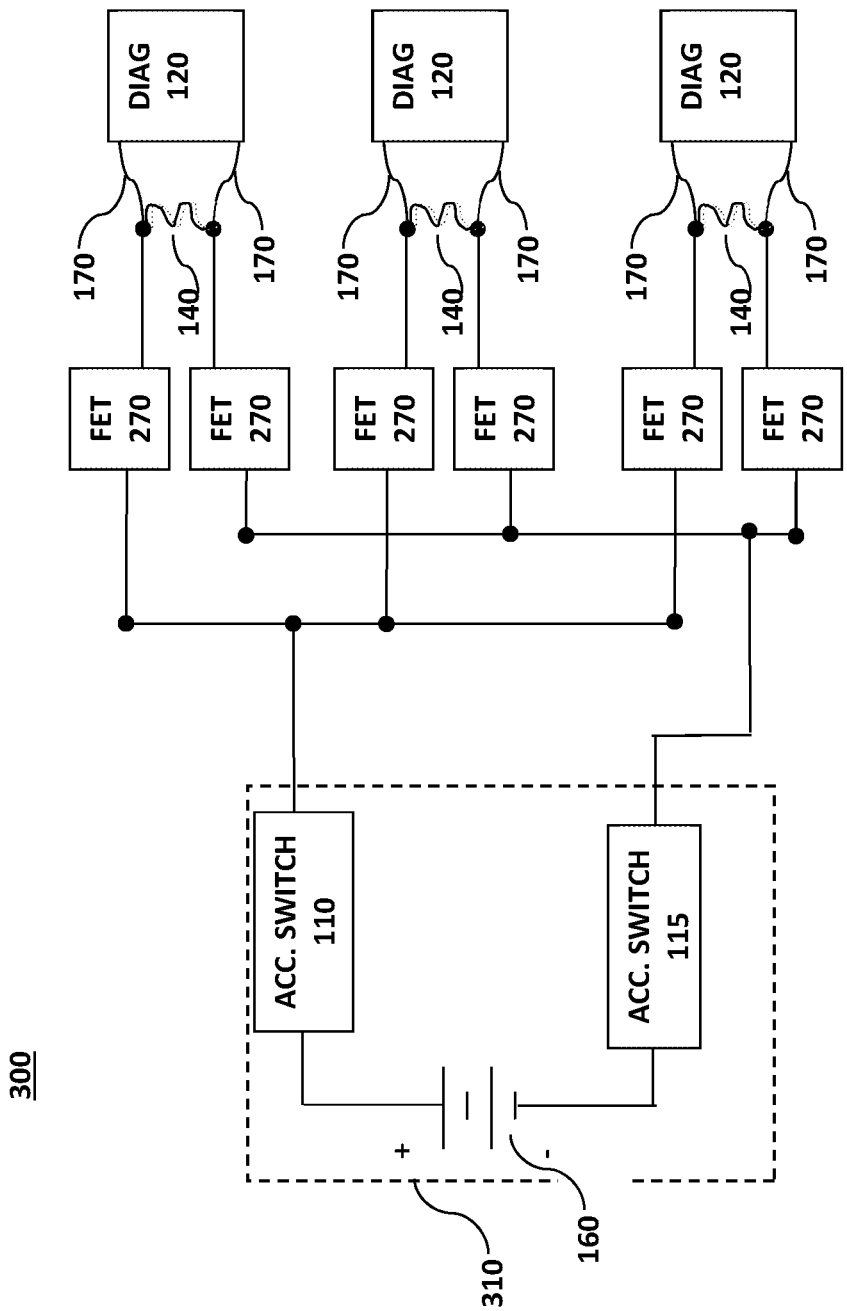
FIG. 3 illustrates a schematic view of multiple diagnostic systems utilizing FET switches according to an embodiment herein.

We refer now to FIG. 3 in particular and to the drawings in general. In a preferred embodiment of the system for diagnosing initiators in airbag systems, where an ECM is used to fire airbags, the system 300 comprises one or a plurality of diagnostic circuits 120, wherein an at least one diagnostic circuit 120 corresponds to an at least one squib 140. The at least one diagnostic circuit 120 should preferably be electrically connected between the ECM event detection circuitry 310 and the outbound wire harness 170, which includes the squib or squibs 140. The ECM event detection circuitry 310 includes at least a power source 160, an acceleration switch 110 electrically connected to the high voltage output of the power source, and an acceleration switch 115 electrically connected to the low voltage output of the power source. The diagnostic circuit 120 comprises a momentary switch which, when closed, connects a system ground to an ECM ground, completing a circuit for a current to flow from the ECM to the system in order for the diagnostic circuit to function. An LED, electrically connected between the momentary switch and the system ground, is included to indicate that the diagnostic circuit is receiving power and is ready to diagnose. Resistors, or other current regulating means as are known in the art, are electrically connected in the diagnostic circuit at a current high input and a current low input in order to regulate the current into the diagnostic circuit to ensure that the squib does not fire during diagnostics. One skilled in the art should appreciate that the resistor value is to be chosen based upon the squib current requirements. A signal booster is electrically connected to the diagnostic circuit at the point of electrical connection to the harness and squib. This signal booster amplifies the signal to a window comparator. The window comparator is electrically connected to the output of the signal booster and determines if the voltage across the harness/squib is good, too high, or too low. One of skill in the art will recognize that the window comparator may include resistors and op-amps that are tuned to detect the desired voltage. The window comparator includes outputs electrically connected to indicators, such as LEDs, to indicate to the user if the voltage is good, high, or low, thereby indicating to the user if the squib and harness integrity is within the desired parameters.

In a preferred embodiment of a method related to the system, as shown in FIG. 4, the method 400 comprises activating a momentary switch 410, completing a circuit 420 whereby a diagnostic circuit may function, indicating to the user 430 that the diagnostic circuit is functioning, regulating the current 440 into the diagnostic circuit so that the squib does not fire, boosting the signal 450 to a window comparator, detecting the desired voltage 460 by the window comparator, giving feedback 470 to the user that the voltage is good, too high, or too low.

Further embodiments of the present invention may include, but are not limited to, systems with multiple diagnostic circuits. Embodiments of the present invention may take advantage of the scalability of the invention and are not limited as to the number of squibs or diagnostic circuits that may be employed in a given embodiment. For example, in the case of aircraft airbag systems, it would be desirable to utilize an embodiment of the present invention comprising one system to diagnose one six-passenger row of seats. This embodiment would comprise six diagnostic circuit systems in order to individually diagnose each of the six airbag squibs. Alternatively, the embodiment may further comprise the six-circuit diagnostic system as above, but utilizing only one user-activated momentary switch in order to get feedback on the health of all six squibs and harnesses individually, but with only one user input.

Referring to FIG. 3, further embodiments of the present invention may include, but are not limited to, the use of electrically connected means 270 to prevent back-flow of current. Such means may be chosen from components including diodes and FET switches. Preferred embodiments of the present invention include the use of FET switches 270 to prevent the back-flow of current, but with a small voltage drop. It is contemplated by the invention that there may be some cases in which a high resistance, or even an open connection, may occur within a trigger loop in a multi-squib system. In this case, embodiments of the present invention may include additional circuitry to balance the current between the squib loops when using an active component, such as a FET, which does not separate the squib loop physically in order to ensure proper diagnostic function. One skilled in the art will recognize that this may be accomplished by various means, for example, by a transistor network. The use of balancing circuits in embodiments of the invention provides means by which each squib, or inflator loop, can be accurately checked for shorts or opens within a specified range without affecting the other inflator loops.

Further embodiments of the present invention may include, but are not limited to, user-activation of the diagnostic circuit via momentary switches that are a pushbutton. Other embodiments contemplated may include, but are not limited to, user-activation of the diagnostic circuitry via an input signal from a user such as, but not limited to, an input signal from processor such as a PC or handheld device, said signal being transmitted either wired or wirelessly.

Further embodiments of the present invention may include, but are not limited to, user-feedback utilizing one or more LEDs. Other embodiments of user feedback contemplated include, but are not limited to, wired or wireless output signals to be received by processor such as a PC or handheld device, or even an audible tone.

It is further contemplated to be within the scope of the present invention that the diagnostic system disclosed herein may be manufactured utilizing discrete components or also as an integrated circuit (IC).

It will be appreciated that the devices, apparatus, and systems described above are set forth by way of example and not of limitation. Numerous variations, additions, omissions, and other modifications will be apparent to one of ordinary skill in the art.

While particular embodiments of the present invention have been shown and described, it will be apparent to those skilled in the art that various changes and modifications in form and details may be made therein without departing from the spirit and scope of the invention as defined by the following claims. The claims that follow are intended to include all such variations and modifications that might fall within their scope, and should be interpreted in the broadest sense allowable by law.

In light of the foregoing description, it should be recognized that embodiments in accordance with the present invention can be realized in numerous configurations contemplated to be within the scope and spirit of the claims. Additionally, the description above is intended by way of example only and is not intended to limit the present invention in any way, except as set forth in the claims.

What is claimed is:

1. A method for diagnosing a plurality of aircraft airbag initiators in an aircraft airbag system, the method comprising:

providing a diagnostic circuit per aircraft seat, each diagnostic circuit electrically connected between an aircraft crash sensing means and one of the plurality of aircraft airbag initiators, the diagnostic circuit being in a normally off condition and enabled by a user activation;

providing a power supply, independent of aircraft power, electrically connected to each diagnostic circuit;

providing a momentary switch;

providing a visual indicator providing feedback to the user of a health of each of the plurality of aircraft airbag initiators, the visual indicator configured to be operative once the user has activated the diagnostic circuit;

receiving a signal indicating user activation of the momentary switch; and responsive to receiving the signal:

completing a circuit for the diagnostic circuit to function, indicating to the user that the diagnostic circuit is functioning;

regulating a current into the diagnostic circuit to prevent an aircraft airbag initiator from firing during diagnostic evaluation;

boosting the signal to a window comparator;

detecting a voltage by the window comparator; and providing feedback to the user about the voltage.

2. The method of claim 1 further comprising using an FET switch to prevent back-flow of electrical current.

3. The method of claim 1 further comprising using diodes to prevent back-flow of electrical current.

4. The method of claim 1 wherein providing the momentary switch comprises providing a pushbutton.

* * * * *